United States Patent [19]

Glascock, II et al.

[11] Patent Number: 4,828,597
[45] Date of Patent: May 9, 1989

[54] FLEXIBLE GLASS FIBER MAT BONDING METHOD

[75] Inventors: Homer H. Glascock, II; Richard O. Carlson, both of Scotia, N.Y.

[73] Assignee: General Electric Company, Schenectady, N.Y.

[21] Appl. No.: 129,817

[22] Filed: Dec. 7, 1987

[51] Int. Cl.⁴ ............................................. C03C 27/04
[52] U.S. Cl. ........................................... 65/42; 65/43; 156/106; 156/107; 156/279
[58] Field of Search ............................. 65/42, 43, 4.1; 156/106, 107, 279

[56] References Cited

U.S. PATENT DOCUMENTS

| | | | |
|---|---|---|---|
| 1,187,346 | 6/1916 | Lea | 65/43 X |
| 2,499,854 | 3/1950 | Ellefson | 65/42 |
| 2,527,720 | 10/1950 | Guyer | 65/43 X |
| 3,117,576 | 4/1965 | Kuzminski et al. | 65/43 X |
| 3,210,171 | 10/1965 | MacDonald | 65/43 |
| 3,410,674 | 11/1968 | Martin | 65/43 X |
| 3,482,149 | 12/1969 | Duke | 65/43 X |
| 3,575,789 | 4/1971 | Siefert et al. | 65/42 X |
| 3,667,925 | 6/1972 | Sheppard | 65/43 |
| 3,689,243 | 9/1972 | Mize | 65/42 |
| 3,865,567 | 2/1975 | Klomp et al. | 65/43 |
| 3,909,332 | 9/1975 | Yerman | 156/309 |
| 4,285,714 | 8/1981 | Kirkpatrick | 65/40 |
| 4,347,074 | 8/1982 | Inohara et al. | 65/32 |

Primary Examiner—Robert L. Lindsay
Attorney, Agent, or Firm—Robert Ochis; James C. Davis, Jr.; Marvin Snyder

[57] ABSTRACT

A method of providing a unitary body comprised of two initially separate layers having similar coefficients of thermal expansion involves forming a mat of glass fibers in a configuration suitable for bonding the two layers together, placing the glass mat between them and heating the resulting stack to a temperature at which the individual fibers of the glass mat deform to form a continuous layer of glass which adheres to both layers, after which the stack is cooled to result in the unitary body.

14 Claims, 4 Drawing Sheets

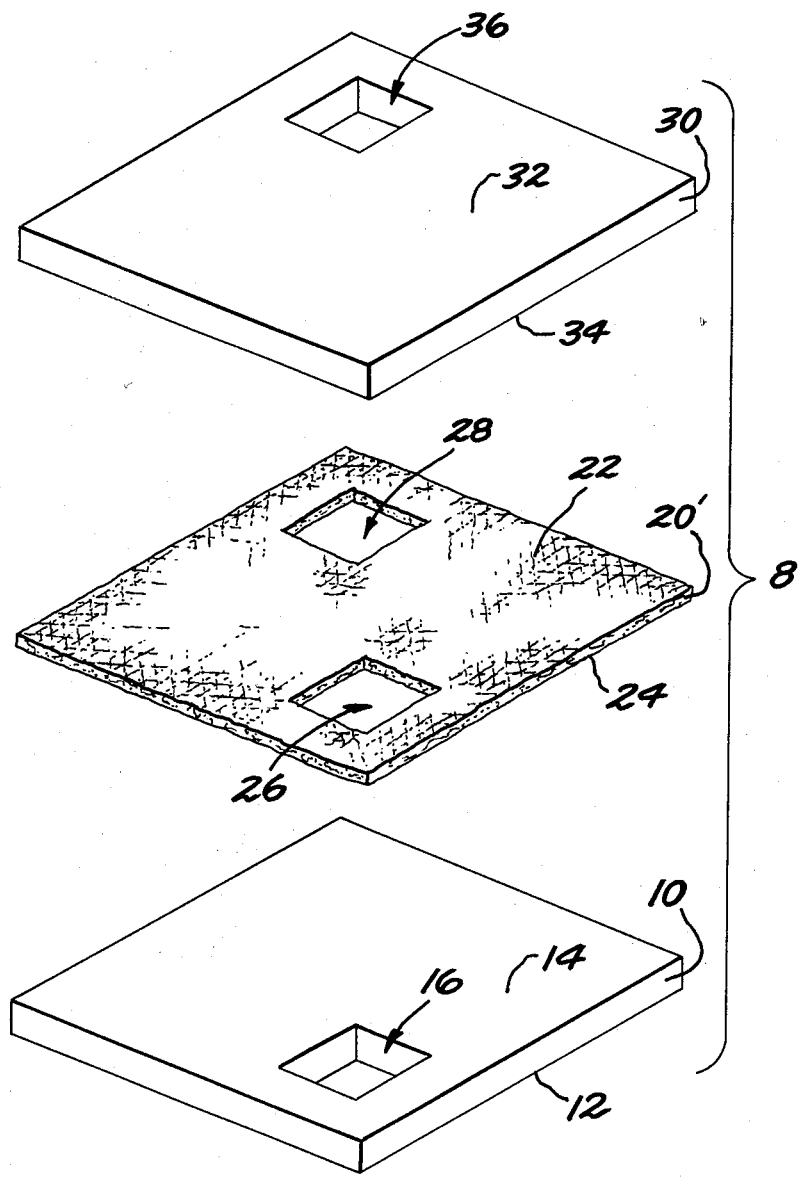

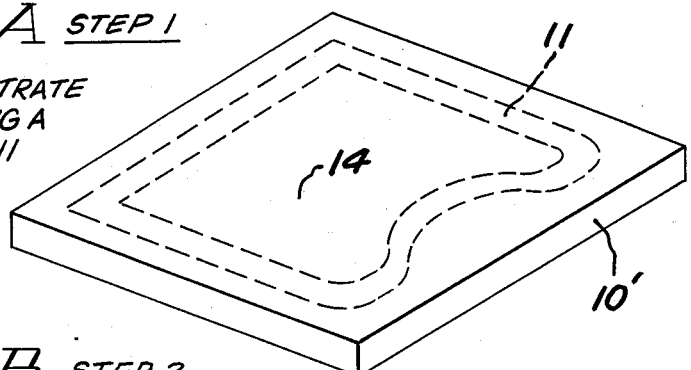
FIG. 5A STEP 1
PROVIDE A SUBSTRATE LAYER 10' HAVING A BONDING FACE 11
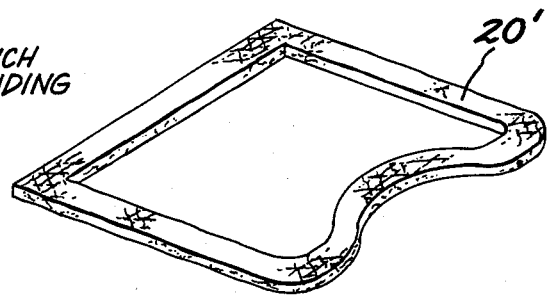
FIG. 5B STEP 2
PROVIDE A GLASS FIBER MAT 20' WHICH MATCHES THE BONDING FACE 11
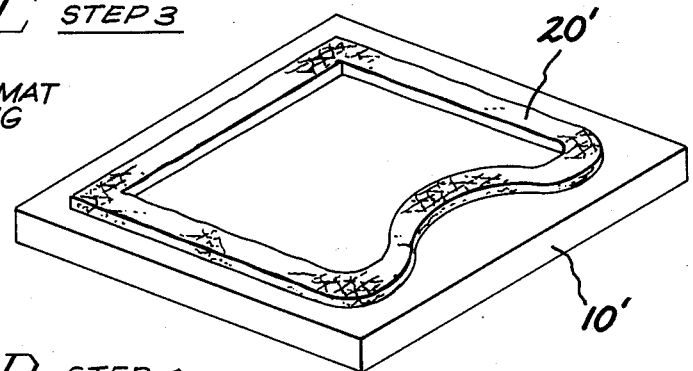
FIG. 5C STEP 3
PLACE GLASS MAT 20' ON BONDING FACE 11
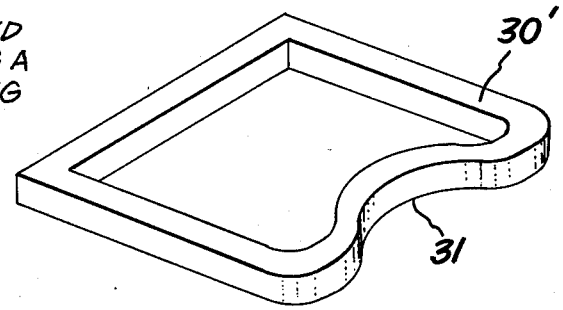
FIG. 5D STEP 4
PROVIDE A SECOND LAYER 30' HAVING A MATCHING BONDING FACE 31

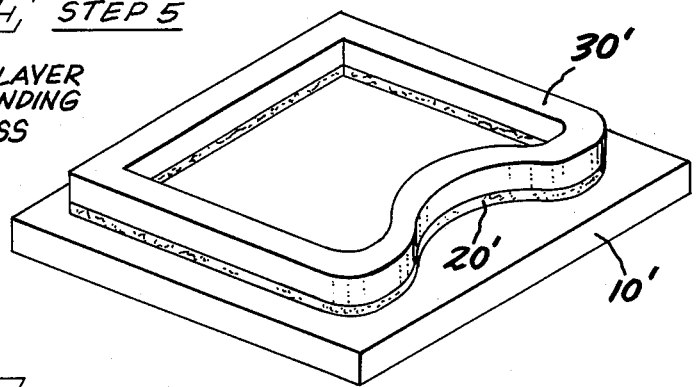
FIG. 5E STEP 5
PLACE SECOND LAYER 30 WITH ITS BONDING FACE 31 ON GLASS MAT 20'
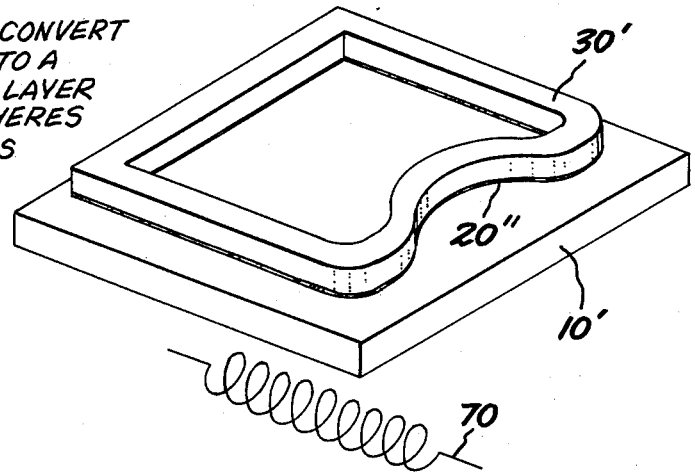
FIG. 5F STEP 6
HEAT STACK TO CONVERT GLASS MAT 20' TO A BONDING GLASS LAYER 20" WHICH ADHERES TO BOTH LAYERS
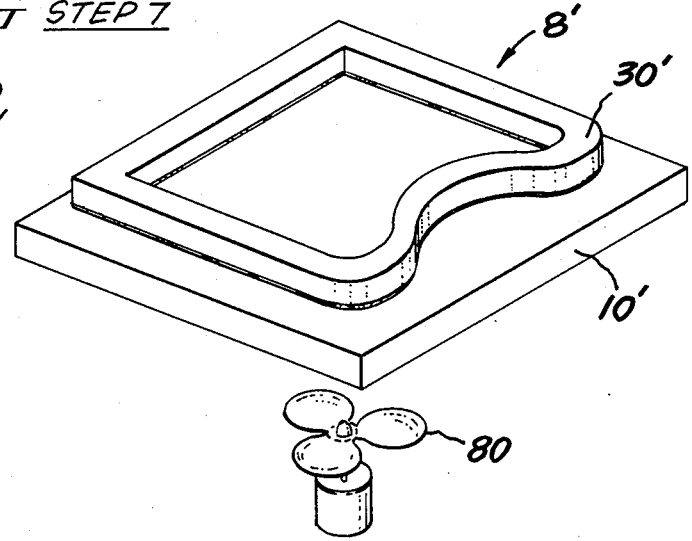
FIG. 5G STEP 7
COOL STACK TO FORM UNITARY BODY 8'

FLEXIBLE GLASS FIBER MAT BONDING METHOD

The Government has right in this invention pursuant to Contract No. F29601-86-C-0020 awarded by the Air Force.

BACKGROUND OF THE INVENTION

The present invention relates to the field of laminated structures and more particularly, to the field of laminated structures suitable for housing electronic components or other uses.

PRIOR ART

In the semiconductor art, it is often desirable to bond together two layers of alumina or two layers of silicon or two layers of dissimilar materials having similar coefficients of thermal expansion. A number of methods have evolved for doing so. One of the most common methods is to metallize both layers by sputtering, evaporation or in the case of conductors, electroplating and then placing them with the metallized layers in contact and bonding them by diffusion or soldering. Such methods have the disadvantage of being expensive, time consuming and/or creating reliability problems in certain structures.

Another method of bonding two layers together includes the use of adhesives such as epoxies. Unfortunately, such adhesives cannot withstand high temperatures, which in many processes are employed subsequent to bonding the two layers together, and such adhesives can also raise long term reliability questions both from a point of view of outgassing and decomposition.

It is also known to screen a glass frit on one of the layers prior to stacking the layers together and heating the layers to a temperature at which the glass frit flows and forms a bond between the two layers. See, for example, U.S. Pat. No. 4,347,074 issued Aug. 31, 1982. Such a technique has the disadvantage, particularly where a patterned bond is needed, of requiring the fabrication of a suitable screen for the patterned deposition of the glass frit. Further, glass frits, which contain binders which must be driven off during the bonding process, create problems for large area bonds (that is, bonds whose area is large compared to their thickness).

Formation of a glass bonding layer by chemical vapor deposition is taught in U.S. Pat. No. 3,909,332 issued Sept. 30, 1975, to A. J. Yerman and assigned to the present assignee. Sputtering is also a known technique for formation of a glass bonding layer. Such techniques require separate masking of those portions of the deposition substrate, which are to be kept free of the glass bonding layer. Such deposition is also time consuming, especially in the case of sputtering. Further, both of these techniques require the use of expensive capital equipment to form the bonding layer, and therefore, are relatively expensive.

Flexible bonding films have been known in the art for a number of years and include those sold as glass transfer tapes by the Vitta Corporation (Wilton, CT 06897). Such bonding layers have the disadvantage of including binders which must be fired off at a temperature in the vicinity of 400° C. in the presence of oxygen prior to completing a bond at a temperature in the vicinity of 500° C. Such a bonding layer is not readily useful for forming large area bonds between substrates because of the difficulty of removing the binder from those portions of the bonding layer which are remote from the edges of the structure.

While a sheet of glass could, in theory, be used to form such a seal, the sealing layer must normally be very thin (less than about 1 mil in thickness) and glass layers of this thickness are extremely fragile and extremely difficult to cut in an inexpensive way without shattering the glass. Thick glass sheets (about 100 mil thick) have been used to bond layers together where such extremely thick bonding layers are needed. See for example, U.S. Pat. No. 4,285,714 issued Aug. 25, 1981.

A bonding technique which is easily used, repeatable and inexpensive is desirable. Accordingly, an object of the present invention is to provide a method of sealing together two layers having similar thermal coefficients of expansion to form a unitary body in a simple, reproducible and inexpensive way.

Another object of the invention is to provide a method of simply and inexpensively sealing two layers together with a thin glass bonding layer therebetween.

Still another object of the invention is to bond two layers together with an intervening thin glass layer which is easily and inexpensively formed to the desired shape of the bonding interface and which provides a reliable seal between the two layers.

A further object of the invention is to provide a glass bonding preform which is easily and inexpensively formed and configured.

A still further object is to form a unitary two layer plus thin glass bonding layer body which is inexpensive to produce and reliable in use.

SUMMARY OF THE INVENTION

In accordance with the present invention, a glass sealing layer is provided between two layers having similar thermal coefficients of expansion by providing the glass layer initially in the form of a flexible mat of glass fibers which is easily cut to the desired bonding shape and which, when heated to a deformation temperature, will form a film between, and adhere to, the bonding faces of the two layers. Where there is an aperture in one of the layers, it is preferred in some applications to form a matching aperture in the glass mat in order that the adjacent layer will be the bottom of the cavity formed by that aperture after bonding rather than there being a glass film on the bottom of that cavity.

A method of forming a unitary laminate body comprises forming the glass mat in the shape of the desired bonding interface between the two layers, placing the glass mat on the bonding surface of one layer in alignment therewith and then placing the other layer with its bonding surface toward the first layer with its bonding face aligned with and on the glass mat. This stack of laminations is then heated to a temperature at which the glass deforms sufficiently to form a continuous film and to bond to the bonding faces of both layers. After a sufficient dwell time at this deformation temperature, the stack is cooled to a temperature at which the glass is no longer deformable. This cooling is normally to room temperature.

Where a final unitary body having more than two layers in it is desired, all of the layers may be stacked with intervening glass mats prior to heating to the deformation temperature whereby a single heating step forms a multi-laminate unitary body.

The resulting unitary body has a substrate layer whose first major surface is bonded to a first major surface of the second layer by an intervening glass bonding layer. Such structures have great utility in many arts and particularly in the electronic packaging art for use as substrates, printed circuit boards and packages for the mounting and packaging of electronic components.

A wide variety of glass compositions having a variety of thermal coefficients of expansion are available with the result that this technique is suitable for use with layers having many different compositions.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2 is a perspective, exploded view of the body of FIG. 1 during the assembly process;

FIG. 5 A-G illustrates the steps in the process of forming the unitary body of FIG. 1.

DETAILED DESCRIPTION

Figure 1:
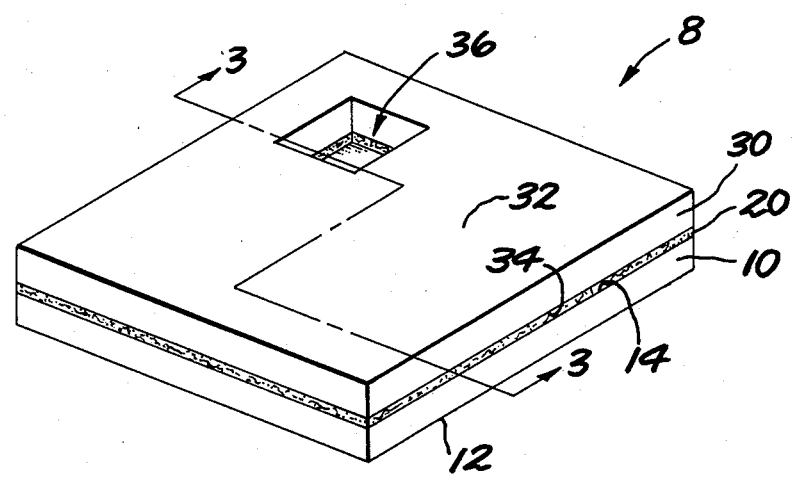
FIG. 1 is a perspective view of a unitary body in accordance with the present invention.

In FIG. 1, a unitary body 8 in accordance with the present invention is illustrated in a perspective view. The unitary body 8 comprises a substrate layer 10 having a bottom surface 12, a top surface 14 and an aperture 16 (FIGS. 2 and 3) therein. A layer 20 of bonding glass is disposed on the top surface 14 of substrate 10. A second layer 30 having an upper surface 32, a lower surface 34 and an aperture 36 therethrough is disposed on top of the glass layer 20. The glass layer 20 is firmly bonded to the upper surface 14 of substrate 10 and the lower surface 34 of second layer 30 thereby securing the stack comprised of substrate 10, glass layer 20 and second layer 30 in the form of a unitary body 8.

The component parts of the body 8 are shown in FIG. 2 in an exploded view prior to assembly. The layer 20, prior to assembly, is a mat 20' of glass fibers having an upper surface 22 and a lower surface 24 and having two apertures 26 and 28 therethrough. The glass mat 20' is cut, formed or initially fabricated in a shape or configuration to cover the bonding portion of the upper surface 14 of the substrate 10 and to cover the bonding portion of the lower surface 34 of the second layer 30. Naturally, the portion of the upper surface 14 of substrate 10 which is exposed by the aperture 28, is not covered by the glass mat and in a similar fashion, the portion of the lower surface 34 of second layer 30 which is exposed by the aperture 26 in the glass mat is not covered by the glass. The apertures 26 and 28 need not be the identical size as their respective matching apertures 16 and 36, but rather can be made slightly smaller or slightly larger in accordance with the thickness and flow characteristics of the glass and whether it is desired to have the bonding glass layer 20 in FIG. 1 extend slightly into the aperture 36, be flush with the aperture 36 or be slightly recessed. If a glass film bottom were desired in the cavities, then the apertures in the glass mat would be omitted whereby the glass mat would form the bottom of the cavity.

Figure 3:
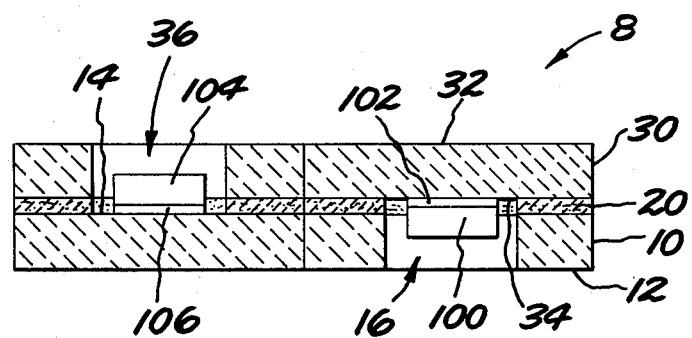
FIG. 3 is a cross-section through the body of FIG. 1 along the line 3—3.

The assembled unitary body 8 is shown in cross-section in FIG. 3 where the cross-section is taken along the line 3—3 of FIG. 1. This figure is largely self-explanatory. It should be noted that in accordance with the apertures formed in the glass mat 20', the glass layer 20 does not cover the upper surface 14 of substrate 10 within the aperture 36 in the upper layer and and does not cover the lower surface 34 of the second layer 30 within the aperture 16 in the substrate 10.

In addition to those elements which are present in FIGS. 1 and 2, two electronic components 100 and 104 are disposed respectively in the apertures 16 and 36 in FIG. 3. The electronic component 100 is secured within the body 8 by a bonding layer 102 disposed between it and the lower surface 34 of second layer 30. The bonding layer 102 adheres to both the electronic component 100 and the lower surface 34 of substrate 30. In a similar manner, the electronic component 104 is secured to the upper surface 14 of substrate 12 by a bonding layer 106. The bonding layers 102 and 106 which secure the components 100 and 104, may be any appropriate material such as epoxy or metal and solder or other known bonding layers. The electronic components 100 and 104 may be any desired electronic component, but most frequently will be an active semiconductor device of some type and most generally, will be an integrated circuit or power device.

Figure 4:
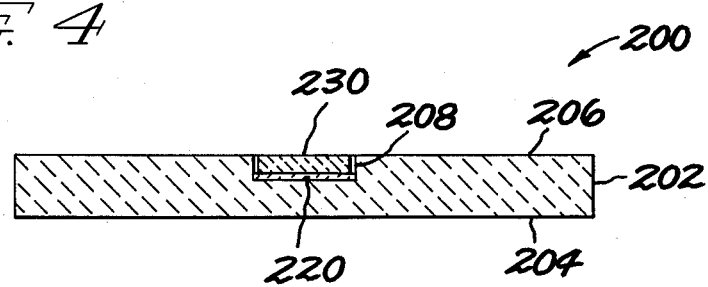
FIG. 4 illustrates, in cross-section, an alternative configuration of the unitary body.

In FIG. 4, an alternative embodiment 200 of the invention is illustrated in cross-section. The body 200 comprises a substrate 202 having a bottom surface 204 and an upper surface 206. The upper surface 206 has a recess or cavity 208 therein in which a second layer 230 is secured by a layer of bonding glass 220 disposed between the bottom of the cavity 208 and the bottom surface of layer 230. Whether the glass layer 220 can or should extend upward in the space between the vertical walls of layer 230 and the vertical walls of cavity 208 depends on the relative thermal coefficients of expansion of the materials comprising the three layers. It is preferred that the spaces between the vertical walls of cavity 208 and layer 230 be very small, but this is optional. This type of structure is desirable where the layer 230 is substantially more expensive than the substrate 202, but has characteristics which make it necessary or highly desirable to have those characteristics at selected points on the substrate 202. An example of such a structure is an alumina ($Al_2O_3$) substrate 202 with a layer 230 of beryllia (BeO) inlaid therein. Such a structure is desirable where the high heat conductivity of the beryllia is necessary in selected locations on the substrate 202, but the much greater cost of the beryllia does not justify its use as the entire substrate. A layered unitary body of $Al_2O_3$, glass and BeO has been successfully formed using the same glass fiber mat as has been used for silicon-to-silicon and alumina-to-alumina bonds. While the glass layer 220 is not as thermally conductive as either the alumina or the beryllia, it is relatively thin at about 0.8 mil and thus may be tolerable in situations where the main function of the beryllia is to spread heat. Alternatively, the thermal conductivity of the bond between the beryllia and the alumina can be increased significantly if a fine powder of a high thermal conductivity material which can withstand the deformation temperature, is either impregnated within the glass mat or spread in a fine layer in the recess 208 either under or over the glass layer. Powders of high melting point metals having appropriate thermal coefficients of expansion are appropriate materials, since electrical insulation is not required between the beryllia and the alumina, or an electrically insulating powder such as alumina or beryllia may be used. A powder of beryllia may render the thermal conductivity of the glass bonding layer 220 close to, equal to or greater than that of alumina and thereby remove the effect of the glass layer as a significant thermal impedance in the path from the beryllia 230 to the alumina 202. The use of beryllia powder has the disadvantage of the toxicity of beryllia which is important in view of the difficulty of producing and controlling the distribution of such a fine powder and preventing it from becoming airborne. However, if those problems can be avoided or overcome, thermal conductivity advantages will be achieved.

Thermal or electrical conductivity modifiers may be included in bonds between other materials as well. Where it is desired to modify the electrical conductivity, metal powders or metal filaments may be incorporated into the glass fiber mat during its manufacture or at the time of its placement. Where those fibers or powders do not deform or flow at the stack formation temperature, the conductivity modifying fibers (or powder) should have a maximum diameter which is about the same as or less than the thickness of the final bonding layer in order to avoid trapping gases (when heating is not in a vacuum) or leaving cavities in the final sealing layer.

The substrate layer 10 and the second layer 30 (FIGS. 1-3) must have similar thermal coefficients of expansion, i.e. which are sufficiently close to each other, and the glass 20 must have a thermal coefficient of expansion which is close to, and preferably between, those thermal coefficients of expansion if they are different, so that the unitary body 8 will not crack or break as a result of different degrees of contraction in the process of cooling from the deformation temperature to the coldest temperature to which the unitary body will be exposed during storage and/or use. The limits of difference in thermal coefficients of expansion for the layers 10 and 30 depend on the temperature at which the unitary body is formed, the severity of thermal shocks to which the structure will be exposed in use and the strength, brittleness and so forth of the layers 10 and 30. Thus, specific limits for specific material combinations are best determined by experimental determination of their success. Such determinations are easily and simply made. Thus, an appropriate thermal coefficient of expansion for the glass is one which is effective for bonding the layers together into a unitary body which is sufficiently durable for its intended use.

We have found that the glass filter paper sold under the trade name Reeve Angel Grade 934AH, which is distributed by Whatman and Company of Clifton, N.J., has a thermal coefficient of expansion which is appropriate for bonding alumina to alumina and for bonding silicon to silicon. This glass filter paper, despite its name, contains no paper. That is, the name "filter paper" is descriptive of the purpose for which it is sold, rather than its composition with the term "glass" specifying its composition. Since silicon has a thermal coefficient of expansion of $3 \times 10^{-6}$ per °C., and alumina has a thermal coefficient of expansion of $7 \times 10^{-6}$ per °C., and this glass paper is effective for bonding both silicon to silicon and alumina to alumina, an exact match between the coefficient of expansion of the glass and the coefficient of expansion of the layers is not required. The durability of these bonds was determined for both a silicon-to-silicon bond and an alumina-to-alumina bond by moving a sample unitary body directly from a liquid nitrogen bath at 77° K. ($-196$° C.) to the surface of a hot plate held at 423° K. (150° C.) for a 346° K. temperature change. Once the temperature of the sample had equilibrated at the high temperature, the sample was moved directly back to the liquid nitrogen. This sequence was repeated for a total of 10 cycles. There was no observable delamination of the structures as a result of this extremely severe thermal shock testing.

Microscopic examination of the glass fiber filter paper indicates that it is a weave of fibers laid in three different directions with relative angles of 60° between them and that the individual fibers are 12 to 15 mils apart. This configuration is not considered crucial for our use of the glass mat since it deforms into a layer during our bonding process. The thickness of the glass mat is in the vicinity of 11 or 12 mils and when heated and deformed to bond two layers together, collapses to a thickness of about 0.8 mils in a final unitary body. In our experience, there is very little, if any, flow of this glass at a deformation temperature of 900° C. in the sense of the glass flowing out from between the two layers being bonded. Thicker or thinner mats and thicker or thinner bonding layers may be used as desired.

We asked Whatman and Company for the composition of the glass of which this filter paper is made. They were unable to obtain this information from the manufacturer. We therefore had an analysis done in an attempt to determine that composition. That analysis was done using X-ray photoelectron spectroscopy. The filter was analyzed twice. Once as received and once after being argon-ion sputtered to remove surface contaminants. The second or ion-sputtered results are believed to more accurately reflect the actual composition of the glass. These results are presented in the table.

TABLE

| Filter | Surface Composition (atom %) | | | | | | | |
|---|---|---|---|---|---|---|---|---|
| | Al | Si | C | Mg | Ca | O | Na | B |
| As received | 2.3 | 22.9 | 17.3 | 2.9 | 2.4 | 50.3 | 0.6 | 1.3 |
| Ion-sputtered | 6.7 | 31.2 | 2.4 | 2.4 | 3.9 | 51.7 | — | 2.0 |

The substantial decrease in carbon and sodium from "as received" to "ion-sputtered" is consistent with carbon and sodium being primarily or exclusively present as a result of surface contamination. However, it should also be recognized that in the normal bonding process, surface contaminants will remain present and become part of the bonding glass layer unless they are present in volatile forms which are driven off during the heating time. However, the volume percent of these contaminants would be very small in the glass layer even if they are not driven off during heating. The carbon is likely to be driven off during heating, especially if any free oxygen is present.

From this analysis, we believed that the glass fibers of which the above-identified filter paper is formed are an aluminum borosilicate glass which contains some calcium. Other glass compositions having suitable coefficients of thermal expansion, can be determined from reference to appropriate handbooks for selecting an appropriate glass composition for forming a glass mat suitable for bonding two layers having a particular coefficient of thermal expansion.

Other layer/substrate combinations which have particular utility in packaging of electronic devices, in particular, integrated circuits and power devices, include bonding silicon to silicon nitride ($Si_3N_4$) ($Si_3N_4$ has a thermal coefficient of expansion of $3\times10^{-6}$ per °C.), silicon to aluminum nitride (AlN) (AlN has a thermal coefficient of expansion of $3\times10^{-6}$ per °C.) and silicon to silicon carbide (SiC) (SiC has a thermal coefficient of expansion of $4\times10^{-6}$ per °C.). Each of these bond combinations can be made with the same glass as silicon-to-silicon or alumina-to-alumina bonds are made. Similarly, if it is desired to bond a layer of a metal such as Kovar TM or similar metals to alumina, this same glass may be utilized. This glass may also be used to bond Kovar-to-Kovar. Kovar is a trademark for a metal alloy which is specially formulated to have a low thermal coefficient of expansion which closely matches that of alumina. Similarly, tungsten and molybdenum which are also low thermal coefficient of expansion metals, may be bonded to themselves, to each other and to other materials having sufficiently closely matched coefficients of thermal expansion. In a similar manner, quartz may be bonded to quartz with such a glass layer. However, a glass fiber having a smaller thermal coefficient of expansion is more appropriate for bonding quartz to quartz than is the glass used for bonding silicon to silicon or alumina to alumina. This listing of appropriate materials is illustrative of the breadth of the invention and not a limitation on that breadth. This technique is useful with any layers which have been or can be bonded together with a glass layer, so long as the glass mat is made of glass having a compsition whose thermal coefficient of expansion is appropriate for bonding those particular layers together.

Some of the advantages of using glass filter paper as a glass preform for the bonding of silicon to silicon or alumina to alumina are that it is relatively inexpensive, that it is free of binders and other materials which would either vaporize or need to be driven off in the process of bonding the two layers together and is quite flexible and can be cut with scissors or a knife, stamped with a die or cut with a laser to form any desired pattern as to shape and apertures therethrough. Thus, no expensive equipment is required for forming the glass mat in the desired configuration unless extremely intricate patterns are needed.

A further advantage of the use of a glass sealing layer, which deforms and seals in the vicinity of 900° C., for use with alumina and similar insulating materials, is the fact that a glass sealing ring (not shown) around the apertures such as 36 may be formed (on surface 32) in the same heating cycle as the stack is bonded into a unitary body. In this way, after mounting semiconductor components in the apertures, cover plates may be secured on the sealing rings in a well known manner. These glass sealing rings may be disposed over already deposited conducting films provided those films can survive the firing temperature and conditions.

This bonding of layers using glass mat preforms has the advantage over metallization and solder techniques that the bond is immune to soldering temperatures and thus does not require the use of solder having a different melting temperature than subsequent soldering steps. This maximizes the availability of different temperature solders for use in subsequent steps.

Another advantage of this bonding technique is the fact that the glass forms a hermetic seal between the layers to which it bonds, thereby being useful in the formation of housings into which integrated circuits and other semiconductor devices are to be hermetically sealed for environmental protection.

A further advantage is the fact that this bonding layer can be heated to its deformation temperature either in air or in nitrogen without any apparent detrimental effect on the bond formed. The choice between air and nitrogen is, therefore, determined by the characteristics of the layers being bonded to each other rather than by the bonding layer itself.

While the unitary body 8 shown in FIGS. 1-3 is illustrated as having relatively small apertures in each of its layers, it will be understood that any of the layers may be continuous without apertures and that rather than the apertures being a small portion of the overall area within the perimeter of the layer, the aperture may encompass substantially the entire area enclosed by the perimeter with only a relatively narrow ridge around the outside whereby the layer forms the lateral walls of a large area cavity. Such a structure is illustrated in FIG. 5 which is discussed in describing the method of formation of the unitary body.

The method of fabricating this unitary body is as follows. The first step is to provide a substrate layer 10' having a bonding face 11. The bonding face 11 may be merely an appropriate portion of the planar upper surface 14 of the substrate 10' (FIG. 5A) or it may be a raised or depressed portion of that surface. The second step is to provide a glass fiber mat 20' having a configuration which matches the bonding face 11 (FIG. 5B). The third step in the process is to place the glass mat 20' on the bonding face 11 as shown in step 3 (FIG. 5C). The fourth step is to provide a second layer 30' having a bonding face 31 which matches the bonding face 11 and the glass fiber mat 20' (FIG. 5D). The fifth step in the process is to place the second layer 30' on the glass mat 20' with its bonding face in alignment with the glass mat and the bonding face 11 of the first layer 10' (FIG. 5E). In FIG. 5E, the glass mat 20' is still in the form of a mat of fibers and therefore is relatively thick. The sixth step is to heat the resulting stack to convert the glass mat 20' into a continuous layer of glass which adheres to both the substrate 10' and the second layer 30' (FIG. 5F, where the heating is shown schematically by heater 70). In FIG. 5F, the glass mat has deformed or converted into a continuous layer 20" which is substantially thinner than the original thickness of mat 20'. With the Reeve Angel Grade 934AH filter paper discussed above, this involves about a 15 to 1 reduction in the separation between the substrate 10' and the layer 30'. The temperature to which the structure must be heated to achieve this bonding will depend on the particular glass used. With the glass filter mats discussed above, an appropriate temperature is in the vicinity of 900° C. and appropriate dwell time at that temperature is on the order of 15 minutes. After that dwell time, the seventh and final step of the process is to cool the stack to a temperature at which the glass is no longer deformable and the stack has become a unitary body (FIG. 5G, where the cooling is shown schematically by fan 80). Typically, this will involve cooling the stack to room temperature.

For samples which are 2 inches square (4 sq. in.), a 1 pound stainless steel weight was placed on top of the laminate stack (separated therefrom by an $Al_2O_3$ spacer). This applied a force of about ¼ lb./sq. in. to the laminate to aid in deforming the glass mat into the bonding layer of glass.

A maximum temperature of 750° C. resulted in a no bond being formed. At a maximum temperature of 850° C., a marginal bond was obtained with a 15 minute dwell. A longer dwell might have resulted in an adequate bond. Good bonds were obtained for maximum temperatures from 900° C. to 940° C. Higher temperatures were not tried because of oven limitations. Dwell times of both 15 and 30 minutes were tried in the preferred temperature range of 900° C.–930° C. for this glass composition without any discernible difference in bond quality. Thus, there is a substantial temperature and time range over which good bonds will result. It will be recognized that with other glass compositions, lower bonding temperatures may be effective or higher ones may be required. quired.

Some bonds were made with two layers of filter glass between the layers being bonded. A thicker glass bonding layer resulted, but no difference in bond quality was discerned. Laminate stacks containing as many as three alumina layers were successfully bonded using one layer of glass filter paper between adjacent alumina layers. The number of layers in a laminate stack is a matter of design choice and larger numbers should be equally effective. In our sample alumina stacks, the bottom layer was 50 mils thick and the other layer(s) was 15 mils thick. Other thicknesses may be used as desired.

If desired, apertures in each of the layers may be aligned to provide a unitary body having an aperture extending therethrough.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of bonding together first and second layers of material having similar coefficients of thermal expansion, said method comprising:
    forming a mat of flexible glass fibers in a configuration matching the desired shape of the bonded interface to be produced between said first and second layers, said glass having a thermal coefficient of expansion which is appropriate for bonding said first and second layers together;
    placing said configured glass mat on the bonding face of said first layer;
    positioning said second layer on said configured mat with the bonding face of said second layer faced toward and in alignment with said bonding face of said first layer to form a stack comprised of said first layer, said glass mat and said second layer;
    heating said stack to a temperature at which said glass is sufficiently deformable for the individual fibers of said mat to merge into a bonding layer and to adhere to said bonding faces of both of said layers under the then existing conditions; and
    cooling said stack to a temperature at which said glass is no longer deformable.

2. The method recited in claim 1 wherein said first and second layers are silicon.

3. The method recited in claim 1 wherein said first and second layers are alumina.

4. The method recited in claim 1 wherein one of said layers is silicon and the other of said layers is silicon carbide.

5. The method recited in claim 1 wherein one of said layers is silicon and the other of said layers is silicon nitride.

6. The method recited in claim 1 wherein one of said layers is silicon and the other of said layers is aluminum nitride.

7. The method recited in claim 1 wherein one of said layers is alumina and the other of said layers is a metal having a thermal coefficient of expansion which closely matches that of alumina.

8. The method recited in claim 1 wherein one of said layers is beryllia and the other of said layers is alumina.

9. The method recited in claim 1 wherein at least one of said layers has an aperture therein and said forming step comprises cutting an aperture in said glass mat to match the aperture in said at least one layer wherein the said positioning step which places said layer having the aperture therein against said glass mat comprises aligning said apertures in said layer and said mat.

10. The method recited in claim 9 wherein said aperture is a central aperture in said second layer and extends close to the boundary of said second layer along all sides whereby the finished stack comprises a cavity of which said first layer comprises the bottom and said second layer comprises the sidewall.

11. The method recited in claim 1 further comprising, prior to said heating step, cutting a second flexible glass mat to a desired configuration and placing said second glass mat on a second bonding face of said second layer; and
    placing a third layer on said second glass mat with a bonding face thereof in alignment with said glass mat and said second bonding face of said second layer.

12. The method recited in claim 1 wherein said glass mat is substantially free of non-gaseous materials which must be driven off during said heating step.

13. The method recited in claim 1 wherein the placing step includes placing a powder of a compatible material in contact with or within said glass mat to modify the thermal or electrical conductivity of the final bond.

14. The method recited in claim 1 wherein said glass mat includes fibers of thermally or electrically conductive material.

* * * * *